United States Patent
Kim et al.

(10) Patent No.: US 8,034,261 B2
(45) Date of Patent: Oct. 11, 2011

(54) ANISOTROPIC CONDUCTIVE FILM COMPOSITION, ANISOTROPIC CONDUCTIVE FILM INCLUDING THE SAME, AND ASSOCIATED METHODS

(75) Inventors: Hyoun Young Kim, Uiwang-si (KR); Dong Seon Uh, Uiwang-si (KR); Jeong Ku Kang, Uiwang-si (KR); Young Hoon Kim, Uiwang-si (KR); Jae Sun Han, Uiwang-si (KR); Ja Young Hwang, Uiwang-si (KR); Gyu Ho Lee, Uiwang-si (KR); Tae Hyun Lee, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 277 days.

(21) Appl. No.: 12/289,963

(22) Filed: Nov. 7, 2008

(65) Prior Publication Data
US 2009/0140216 A1    Jun. 4, 2009

(30) Foreign Application Priority Data
Nov. 8, 2007    (KR) .................. 10-2007-0113749

(51) Int. Cl.
*H01B 1/06* (2006.01)
*H01B 1/02* (2006.01)
*C08K 9/00* (2006.01)

(52) U.S. Cl. .................. 252/511; 252/512; 523/200

(58) Field of Classification Search .................. 252/511, 252/512; 523/200
See application file for complete search history.

(56) References Cited

U.S. PATENT DOCUMENTS

| | | | | |
|---|---|---|---|---|
| 5,330,684 | A * | 7/1994 | Emori et al. ................. | 252/512 |
| 5,512,613 | A | 4/1996 | Afzali-Ardakani et al. | |
| 5,560,934 | A | 10/1996 | Afzali-Ardakani et al. | |
| 6,008,266 | A | 12/1999 | Kuczynski et al. | |
| 6,114,413 | A * | 9/2000 | Kang et al. .................... | 523/210 |
| 6,309,502 | B1 * | 10/2001 | Hiroshige et al. .......... | 156/273.3 |
| 6,812,065 | B1 * | 11/2004 | Kitamura ...................... | 438/119 |
| 7,776,993 | B2 * | 8/2010 | Buchwalter et al. .......... | 528/230 |
| 2004/0206943 | A1 * | 10/2004 | Saito et al. .................... | 252/500 |
| 2005/0136246 | A1 * | 6/2005 | Hiraoka et al. ............... | 428/323 |

FOREIGN PATENT DOCUMENTS

| | | | |
|---|---|---|---|
| JP | 07-173448 | A | 7/1995 |
| JP | 2003-155325 | | 5/2003 |
| JP | 2003-229024 | A | 8/2003 |
| JP | 2005-298728 | | 10/2005 |
| JP | 2005-343990 | * | 12/2005 |
| KR | 10-2004-0023153 | A | 3/2004 |
| KR | 10-2004-0036219 | A | 4/2004 |
| KR | 10-2006-0077973 | A | 7/2006 |

* cited by examiner

*Primary Examiner* — Mark Kopec
*Assistant Examiner* — Jaison Thomas
(74) *Attorney, Agent, or Firm* — Lee & Morse, P.C.

(57) ABSTRACT

An anisotropic conductive film composition includes a polymer resin, a first epoxy resin including at least one of a bisphenol epoxy resin, a novolac epoxy resin, a glycidyl epoxy resin, an aliphatic epoxy resin, and an alicyclic epoxy resin, a second epoxy resin including an acetal epoxy resin, an epoxy resin curing agent, and conductive particles.

12 Claims, 4 Drawing Sheets

Formula 1

Formula 2

Formula 3

Formula 1

Formula 2

Formula 3

FIG. 2

Table 1: Measurement results of initial adhesive strength and adhesion reliability

| Adhesive Strength [gf/cm] | Initial | After reliability evaluation under high temperature/high humidity conditions | After reliability evaluation under thermal shock conditions |
|---|---|---|---|
| Example 1 | 916 | 959 | 984 |
| Example 2 | 927 | 961 | 985 |
| Comparative Example 1 | 857 | 925 | 943 |
| Comparative Example 2 | 930 | 955 | 949 |

FIG. 3

Table 2: Measurement results of initial connection resistance and connection reliability

| Connection resistance [Ω] | Initial | After reliability evaluation under high temperature/high humidity conditions | After reliability evaluation under thermal shock conditions |
|---|---|---|---|
| Example 1 | 0.70 | 1.49 | 1.45 |
| Example 2 | 0.68 | 1.39 | 1.34 |
| Comparative Example 1 | 0.73 | 1.49 | 1.47 |
| Comparative Example 2 | 0.81 | 1.48 | 1.35 |

FIG. 4

Table 3: Measurement results of the time required for removal of the films

| [sec] | Removal time |
|---|---|
| Example 1 | 150 |
| Example 2 | 140 |
| Comparative Example 1 | 300 |
| Comparative Example 2 | 270 |

ANISOTROPIC CONDUCTIVE FILM COMPOSITION, ANISOTROPIC CONDUCTIVE FILM INCLUDING THE SAME, AND ASSOCIATED METHODS

BACKGROUND OF THE INVENTION

1. Field of the Invention

Embodiments relate to an epoxy curable composition for producing an anisotropic conductive film (hereinafter, also referred to as an 'anisotropic conductive film composition' or simply as an 'ACF composition'), an anisotropic conductive film including the same, and associated methods.

2. Description of the Related Art

An anisotropic conductive film (ACF) generally refers to a film-like adhesive in which conductive particles are dispersed in an electrically insulating adhesive resin. Generally, the anisotropic conductive film may be positioned between circuits, followed by heating/pressing under specific conditions to electrically connect circuit terminals of the circuits. The electrically insulating adhesive resin fills a space between the adjacent circuit terminals and electrically isolates the conductive particles from one another. Generally, anisotropic conductive films are widely used to electrically connect LCD panels or printed circuit boards (PCBs) to tape carrier packages (TCPs).

With recent trends towards large-area and thin displays, spaces between electrodes and circuits are becoming gradually narrower. Anisotropic conductive films play a very important role in interconnecting microcircuit terminals. Under these circumstances, anisotropic conductive films have received a great deal of attention as connection materials for chip-on-glass (COG) mounting, chip-on-film (COF) mounting, etc.

Conventional anisotropic conductive films include two types, i.e. epoxy and acrylic. A typical epoxy anisotropic conductive film is produced by mixing a binder resin system acting as a matrix for film formation with a cure system composed of an epoxy or phenolic resin and a curing agent, and a typical acrylic anisotropic conductive film is produced by mixing a binder resin system with a cure system composed of (meth)acrylic oligomer or monomer and a radical initiator.

The epoxy anisotropic conductive film has excellent initial physical properties due to the inherent characteristics of the epoxy resin, and exhibits good reliability due to the presence of a number of aromatic benzene rings within a network structure after curing. However, since the production of the epoxy anisotropic conductive film requires a very high reaction temperature and a long reaction time, there are difficulties in controlling processing factors and in the maintenance and repair of a connection system. To solve such processing-related problems, encapsulated latent curing agents and cationic curing agents that can lower the reaction temperature and shorten the reaction time of epoxy resins have been developed in recent years. However, when defects are found in a device incorporating the anisotropic conductive film, good adhesiveness inherent to the epoxy resin and a number of aromatic benzene rings present within the network structure make it very difficult to remove the anisotropic conductive film, making re-work difficult.

SUMMARY OF THE INVENTION

Embodiments are therefore directed to an anisotropic conductive film composition, an anisotropic conductive film including the same, and associated methods, which substantially overcome one or more of the problems due to the limitations and disadvantages of the related art.

It is therefore a feature of an embodiment to provide an anisotropic conductive film composition that provides good electrical conductivity and includes an acetal epoxy resin that forms a stable adhesive film.

It is therefore another feature of an embodiment to provide an anisotropic conductive film that achieves high initial adhesive strength and low connection resistance.

It is therefore another feature of an embodiment to provide an anisotropic conductive film that enables milder processing conditions while providing reliable connections between circuit terminals even under high temperature/high humidity conditions and under thermal shock conditions.

It is therefore another feature of an embodiment to provide an anisotropic conductive film that is readily removed for re-work of defective parts.

At least one of the above and other features and advantages may be realized by providing an anisotropic conductive film composition including a polymer resin, a first epoxy resin including at least one of a bisphenol epoxy resin, a novolac epoxy resin, a glycidyl epoxy resin, an aliphatic epoxy resin, and an alicyclic epoxy resin, a second epoxy resin including an acetal epoxy resin, an epoxy resin curing agent, and conductive particles.

The composition may include about 1 to about 50% by weight of the polymer resin, about 1 to about 80% by weight of the first epoxy resin, about 1 to about 50% by weight of the second epoxy resin, about 0.1 to about 15% by weight of the epoxy resin curing agent, and about 0.01 to about 20% by weight of the conductive particles.

The acetal epoxy resin may be represented by Formula 2 or 3:

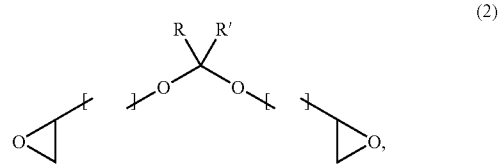

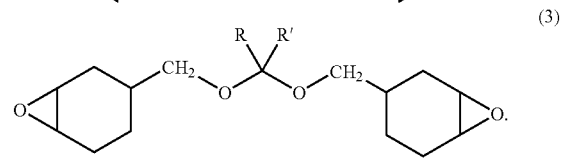

In Formulae 2 and 3, R and R' may each independently be a hydrogen, a $C_1$-$C_{20}$ alkyl group, an aryl group, or an aralkyl group, and in Formula 2, each [ ] may independently be an alkylene.

The acetal epoxy resin may have a weight average molecular weight of about 100 to about 500,000.

The polymer resin may include at least one of an acrylonitrile resin, a styrene-acrylonitrile resin, a butadiene resin, an acrylic resin, a urethane resin, an epoxy resin, a phenoxy resin, a polyamide resin, an olefin resin, and a silicone resin, and may have a weight average molecular weight of about 1,000 to about 1,000,000. The polymer resin may have a glass transition temperature of about 100° C. to about 200° C.

The first epoxy resin may include at least one of a solid epoxy resin, a liquid epoxy resin, and a soluble epoxy resin. The first epoxy resin may include may include a fluorene group represented by Formula 1:

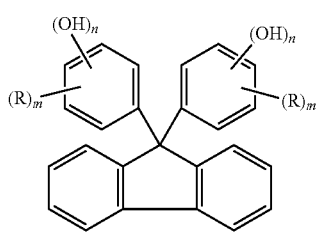

(1)

In Formula 1, each R may independently be alkyl, alkoxy, aryl, or cycloalkyl, each m may independently be an integer from 0 to 4, and each n may independently be an integer from 2 to 5.

The epoxy resin curing agent may include at least one of an acid anhydride curing agent, an amine curing agent, an imidazole curing agent, a hydrazide curing agent, and a cationic curing agent.

The conductive particles may include at least one of metal particles, carbon particles, metal-coated resin particles, and conductive particles coated with insulating particles.

The composition may further include an additive including at least one of a polymerization inhibitor, an antioxidant, a heat stabilizer, a curing accelerator, and a coupling agent. The composition may include about 0.01 to about 5% by weight of the additive.

At least one of the above and other features and advantages may also be realized by providing an anisotropic conductive film including a polymer resin, a first epoxy resin including at least one of a bisphenol epoxy resin, a novolac epoxy resin, a glycidyl epoxy resin, an aliphatic epoxy resin, and an alicyclic epoxy resin, a second epoxy resin including an acetal epoxy resin, an epoxy resin curing agent, and conductive particles.

At least one of the above and other features and advantages may also be realized by providing a method of forming an anisotropic conductive film, the method including providing an anisotropic conductive film composition and forming the composition into a film shape. The composition may include a polymer resin, a first epoxy resin including at least one of a bisphenol epoxy resin, a novolac epoxy resin, a glycidyl epoxy resin, an aliphatic epoxy resin, and an alicyclic epoxy resin, a second epoxy resin including an acetal epoxy resin, an epoxy resin curing agent, and conductive particles.

BRIEF DESCRIPTION OF THE DRAWINGS

The above and other features and advantages of the present invention will become more apparent to those of ordinary skill in the art by describing in detail exemplary embodiments with reference to the attached drawings, in which:

FIG. 2 illustrates Table 1 listing initial adhesive strength and adhesion reliability for samples prepared in Examples 1 and 2 and Comparative Examples 1 and 2;

FIG. 3 illustrates Table 2 listing initial connection resistance and connection reliability for samples prepared in Examples 1 and 2 and Comparative Examples 1 and 2; and FIG. 4 illustrates Table 3 listing time required for removal of films for samples prepared in Examples 1 and 2 and Comparative Examples 1 and 2.

DETAILED DESCRIPTION OF THE INVENTION

Figure 1:
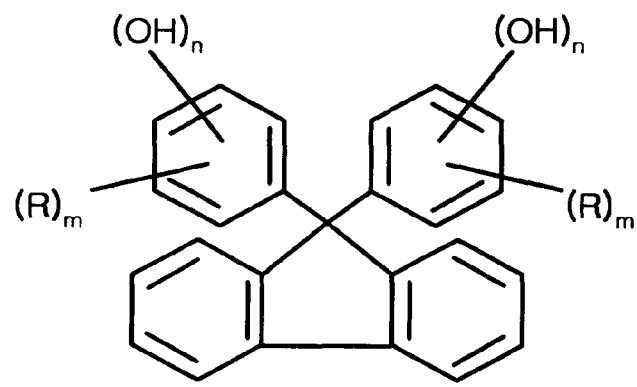
FIG. 1 illustrates Formulae 1 through 3.
Figure 1:
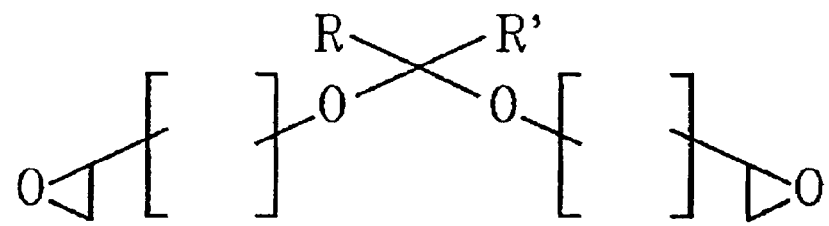
Figure 1:
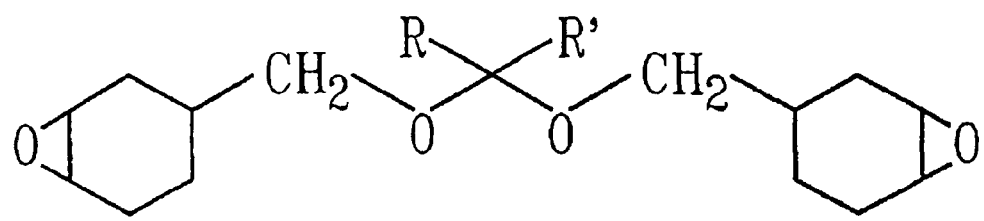

Korean Patent Application No. 10-2007-0113749, filed on Nov. 8, 2007, in the Korean Intellectual Property Office, and entitled: "Composition for Producing Anisotropic Conductive Film and Anisotropic Conductive Film Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "an epoxy resin curing agent" may represent a single compound, e.g., imidazole, or multiple compounds in combination, e.g., imidazole mixed with an aromatic sulfonium hexafluoroantimonate.

As used herein, molecular weights of polymeric materials are weight average molecular weights, unless otherwise indicated.

As used herein, the language "parts by weight, based on the total amount of the adhesive film composition" is exclusive of solvent, unless otherwise indicated. That is, as used herein, the point of reference "the total amount of the adhesive film composition" does not include solvent. For example, where a composition is composed of two components A and B, with A present in 35 parts by weight and B present in 65 parts by weight, based on the total amount of the adhesive film composition, the addition of 10 parts by weight of solvent to the composition would result in the composition continuing to have 35 parts by weight A and 65 parts by weight B, based on the total amount of the adhesive film composition.

As used herein, the term "acetal" is defined to include both acetals and ketals.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer, or section discussed below could be termed second element, component, region, layer, or section without departing from the teachings of the present invention.

An embodiment provides an anisotropic conductive film composition, including a polymer resin, a first epoxy resin including at least one of a bisphenol epoxy resin, a novolac epoxy resin, a glycidyl epoxy resin, an aliphatic epoxy resin, and an alicyclic epoxy resin, a second epoxy resin including an acetal epoxy resin, an epoxy resin curing agent, and conductive particles.

Preferably, the anisotropic conductive film composition includes about 1 to about 50% by weight of the polymer resin, about 1 to about 80% by weight of the first epoxy resin which may include at least one of a bisphenol epoxy resin, a novolac epoxy resin, a glycidyl epoxy resin, an aliphatic epoxy resin, and an alicyclic epoxy resin, about 1 to about 50% by weight of the second epoxy resin, about 0.1 to about 15% by weight of the epoxy resin curing agent, and about 0.01 to about 20% by weight of the conductive particles.

The acetal epoxy resin may be used as a cure system component to achieve high initial adhesive strength and low initial connection resistance of the ACF composition, and to maintain high adhesion reliability for connection structures and various adherents, such as zinc, copper, and polyimide, even under high temperature/high humidity conditions and under thermal shock conditions. In addition, the use of the acetal epoxy resin may allow a final cured anisotropic conductive film to be readily removed, e.g., for recovery of defective display panels found during mounting, contributing to an improvement in the production yield of display devices.

The polymer resin constitutes a binder system acting as a matrix for film formation. In an embodiment, the polymer resin may include at least one of an acrylonitrile resin, a styrene-acrylonitrile resin, a butadiene resin, an acrylic resin, a urethane resin, an epoxy resin, a phenoxy resin, a polyamide resin, an olefin resin, and a silicone resin. These polymer resins may be used alone or as a mixture of two or more thereof. In another embodiment, the polymer resin may include at least one of a polyvinyl butyral resin, a polyvinyl formal resin, a polyester resin, a phenolic resin, an epoxy resin, a phenoxy resin, and an acrylic resin.

The weight average molecular weight of the polymer resin is preferably about 1,000 to about 1,000,000. Maintaining the weight average molecular weight at about 1,000 or more may help ensure that a film produced using the polymer resin exhibits good tack properties, advantageously leading to satisfactory film molding. Maintaining the weight average molecular weight at about 1,000,000 or less may help ensure that the polymer resin is compatible with the first epoxy resin and the other components participating in curing, enabling the preparation of a homogeneous solution.

Styrene-acrylonitrile copolymer resins are particularly suitable for use in the ACF composition because of their high reliability. Generally, styrene-acrylonitrile copolymer resins are transparent, heat-resistant styrene polymers that exhibit excellent characteristics in terms of electrical properties, mechanical properties, chemical resistance, dimensional stability, solvent resistance (except ketones), optical transparency, etc.

Examples of styrene-acrylonitrile copolymer resins which may be used for the polymer resin include styrene-acrylonitrile (SAN) copolymers and acrylonitrile-styrene-acrylate (ASA) copolymers, which may be prepared by suitable polymerization processes, including emulsion, suspension, and bulk polymerization. As the acrylonitrile content of a styrene-acrylonitrile copolymer resin increases, the physical properties and other characteristics of the copolymer resin may be improved, although the processability and the heat stability of the copolymer resin during processing may be deteriorated. In consideration of the advantages and disadvantages, continuous bulk polymerization processes may be more preferable over other polymerization processes for the preparation of styrene-acrylonitrile copolymer resins with higher transparency and better physical properties, except for special cases (for example, SAN resins having a high acrylonitrile content).

The polymer resin may include any suitable copolymer that can be synthesized from styrene and acrylonitrile monomers by polymerization processes known in the art, and examples thereof include various kinds of known styrene-acrylonitrile copolymers and mixtures thereof.

The polymer resin may include SAN resins (AP series) commercially available from Cheil Industries (Korea), SAN resins (SAN series) commercially available from Kumho Petrochemical (Korea), SAN resins (Lustran series) commercially available from BAYER, and ASA resins (Luran S series) commercially available from BASF. A suitable polymer resin may be selected from styrene-acrylonitrile copolymer resins whose weight average molecular weights are several hundreds to several hundreds of thousands and whose glass transition temperatures are in a wide range.

The polymer resin is preferably a styrene-acrylonitrile copolymer resin with a weight average molecular weight of about 5,000 to about 200,000 and a glass transition temperature of at least about 100° C., typically about 100° C. to about 200° C. Maintaining the weight average molecular weight at about 5,000 or more may help ensure that the polymer resin contributes to the film formation. Maintaining the weight average molecular weight at about 200,000 or less may help ensure that the polymer resin is compatible. Maintaining a glass transition temperature of about 100° C. to about 200° C. may be particularly advantageous in terms of reliability. The styrene-acrylonitrile copolymer resin is preferably present in an amount of about 1 to about 50% by weight, based on the total weight of the composition. Maintaining the amount of styrene-acrylonitrile copolymer resin at about 1% by weight or more may help ensure that a film produced using the resin exhibits high reliability. Maintaining the amount of the styrene-acrylonitrile copolymer resin at about 50% by weight or less may help ensure that the anisotropic conductive film produced is less brittle, making it easier to use.

The anisotropic conductive composition may include, as a cure system component, a first epoxy resin which may include at least one of a bisphenol epoxy resin, a novolac epoxy resin, a glycidyl epoxy resin, an aliphatic epoxy resin, and an alicyclic epoxy resin, which may provide sufficient adhesive strength and connection reliability between connection layers after curing.

In an embodiment, the first epoxy resin may be a combination of an epoxy resin in a solid state at room temperature, an epoxy resin in a liquid state at room temperature, and optionally, a soluble epoxy resin. Examples of the first epoxy resin in a solid state at room temperature may include a phenol novolac epoxy resin, a cresol novolac epoxy resin, an epoxy resin having dicyclopentadiene as a main skeleton, a bisphenol A or F epoxy resin, or a modified epoxy resin thereof. Examples of the first epoxy resin in a liquid state at room temperature may include a bisphenol A epoxy resin, a bisphenol F epoxy resin, or a mixture thereof.

Examples of the soluble epoxy resin may include a dimer acid-modified epoxy resin, an epoxy resin having propylene glycol as a main skeleton, and a urethane modified epoxy resin.

The first epoxy resin is preferably used in an amount of about 1 to about 80% by weight, based on the total weight of the composition.

For the first epoxy resin, examples of commercially available epoxy materials may include DER-331 (DOW Chemical), YDCN-500-80P and (Kukdo Chemical Co., Ltd. (Korea)), YDCN-500-90P (Kukdo Chemical Co., Ltd. (Korea)), YP-50 (Tohto Chemical Co., Ltd. (Japan)), and PKFE (INCHEMREZ (USA)).

In another embodiment, a fluorene epoxy resin may be used in the composition. The fluorene epoxy resin may provide superior insulating properties, due to its inherent molecular structure, to reduce the possibility of short-circuiting between circuits. Further, the use of the fluorene epoxy resin may ensure low initial connection resistance and high reliability of the ACF composition to improve the productivity and reliability of a final anisotropic conductive film.

The first epoxy resin may include a fluorene group, which may have a basic molecular structure represented by Formula 1:

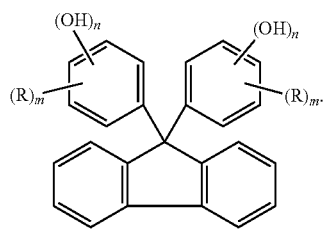

(1)

In Formula 1, each R may independently be alkyl, alkoxy, aryl, or cycloalkyl, each m may independently be an integer from 0 to 4, and each n may independently be an integer from 2 to 5.

The fluorene group of Formula 1 may be prepared via the reaction of an aromatic diazoaluminum compound and copper ions to form aryl radicals (Pschorr reaction). Alternatively, the fluorene group of Formula 1 may be prepared by reacting an indene compound with a butadiene compound (Diels-Alder reaction) to prepare a fluorene, oxidizing the fluorene in air to obtain a fluorenone, and condensing the fluorenone with a phenol compound in the presence of a thiol compound, e.g., mercaptocarboxylic acid, in an aqueous hydrochloric acid solution.

The fluorene epoxy resin may preferably be used in an amount of about 1 to about 30% by weight, based on the total weight of the composition. Maintaining the amount of fluorene epoxy resin at about 30% by weight or less may help ensure that too rigid a structure is not obtained after curing, and may result in little or no shrinkage.

Examples of fluorene epoxy resins may include BPFG and BPEGF, both of which are commercially available from Osaka Gas Co., Ltd. (Japan).

The epoxy curable ACF composition may further include a second epoxy resin including an acetal epoxy resin as a cure system component. The use of an acetal epoxy resin in the anisotropic conductive film composition may allow a final cured anisotropic conductive film to be readily removed for re-work of defective display panels found during mounting, contributing to an improvement in the production yield of display devices.

The acetal epoxy resin refers to an epoxy resin having an acetal bond in the molecular structure. As used herein, the term "acetal" is defined to include both acetals and ketals.

The acetal epoxy resin may have a basic molecular structure represented by Formula 2 or 3:

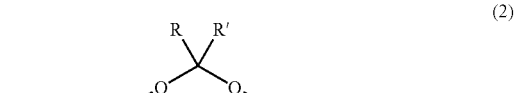

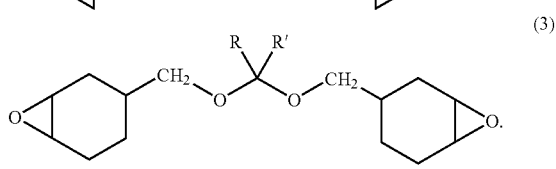

In Formulae 2 and 3, R and R' may each independently be a hydrogen, a $C_1$-$C_{20}$ alkyl group, an aryl group, or an aralkyl group, and in Formula 2, each [ ] may independently be an alkylene.

The central acetal bond in the molecular structure of the acetal epoxy resin is thermally stable, but may be cleaved by an acid. Taking advantage of these structural characteristics, the use of the acetal epoxy resin in an epoxy adhesive composition for mounting an electronic component of a display or semiconductor may facilitate the removal of defective parts found during mounting, while maintaining excellent initial physical properties to improve the production yield of the display or semiconductor and achieve cost reduction.

The second epoxy resin may preferably be used in an amount of about 1 to about 50% by weight, based on the total weight of the composition.

Acetal epoxy resin products were manufactured by Union Carbide, but are no longer available. The synthesis of an acetal epoxy resin may be found in the Example Section (see Synthesis Example 1 below).

The ACF composition may include an epoxy resin curing agent as another cure system component.

In an embodiment, any suitable epoxy resin curing agent known in the art may be used without limitation in the ACF composition, and specific examples of the epoxy resin curing agent may include an acid anhydride curing agent, an amine curing agent, an imidazole curing agent, a hydrazide curing agent, and a cationic curing agent. These epoxy resin curing agents may be used alone, or as a mixture of two or more thereof.

The epoxy resin curing agent is preferably present in an amount of about 0.1 to about 15% by weight, based on the total weight of the composition.

The conductive particles used in the ACF composition may serve as fillers to impart conducting properties to the epoxy ACF composition.

In an embodiment, any suitable conductive particles known in the art may be used without limitation in the ACF composition, and examples thereof include: metal particles, such as Au, Ag, Ni, Cu and solder metal particles; carbon particles; metal-coated resin particles, such as polyethylene, polypropylene, polyester, polystyrene, polyvinyl alcohol, benzoguanamine or a modified resin thereof coated with Au, Ag or Ni; and conductive particles coated with insulating particles.

The size of the conductive particles may be about 2 to about 30 μm, depending on the pitch of circuits employed. The conductive particles are preferably present in an amount of about 0.01 to about 20%, and more preferably about 3 to about 10% by weight, based on the total weight of the composition.

The anisotropic conductive film composition may further include one or more additives, e.g., a polymerization inhibitor, an antioxidant, a heat stabilizer, a curing accelerator, a coupling agent, etc. When included, such additives are preferably present in an amount of about 0.01 to about 5% by weight based on the total weight of the composition.

Examples of suitable polymerization inhibitors may include hydroquinone, hydroquinone monomethyl ether, p-benzoquinone, phenothiazine, and mixtures thereof. Examples of suitable antioxidants may include branched phenolic antioxidants and hydroxycinnamates. These antioxidants may serve to prevent oxidation of the composition as a result of heat exposure, imparting heat stability to the composition. In another embodiment, examples of the antioxidants may include tetrakis-(methylene-(3,5-di-t-butyl-4-hydrocinnamate)methane, 3,5-bis(1,1-dimethylethyl)-4-hydroxybenzenepropanoic acid, thiol di-2,1-ethanediyl ester, octadecyl 3,5-di-t-butyl-4-hydroxyhydrocinnamate, all of which are commercially available from Ciba, and 2,6-di-t-butyl-p-methylphenol. Examples of suitable curing accelerators may include solid imidazole curing accelerators, solid amine curing accelerators, and liquid amine curing accelerators. Examples of suitable coupling agents may include vinyltrichlorosilane, vinyltrimethoxysilane, 3-glycidoxypropyltrimethoxysilane, 3-methacryloxypropyltrimethoxysilane, 2-aminoethyl-3-aminopropylmethyldimethoxysilane, and 3-ureidopropyltriethoxysilane. These silane coupling agents may be used alone or as a mixture of two or more thereof.

Another embodiment provides an anisotropic conductive film formed using the ACF composition.

A general apparatus or equipment may be used to produce the anisotropic conductive film using the ACF composition. For example, the anisotropic conductive film may be produced by the following procedure. First, a polymer resin including at least one of a polymer resin known to act as a matrix for film formation is dissolved in an organic solvent to obtain a polymer binder system in a solution state. Then, a first epoxy resin including at least one of a bisphenol epoxy resin, a novolac epoxy resin, a glycidyl epoxy resin, an aliphatic epoxy resin, and an alicyclic epoxy resin, is mixed with a second epoxy resin including an acetal epoxy resin to obtain a cure system. The binder system, the cure system, the epoxy resin curing agent, the conductive particles, and the additive are stirred for a given time at a rate that does not break the conductive particles. The mixture is applied to a thickness of about 10 to about 50 μm on a release film and dried for a time sufficient to evaporate the organic solvent, completing the production of the anisotropic conductive film having a monolayer structure. The procedure may be repeated one or more times to produce an anisotropic conductive film having a bilayer or multilayer structure.

The following Examples and Comparative Examples are provided in order to set forth particular details of one or more embodiments. However, it will be understood that the embodiments are not limited to the particular details described.

EXAMPLES

Synthesis Example 1

An acetal epoxy resin was synthesized from acetaldehyde bis(cyclohex-3-enylmethyl)acetal. First, the acetal compound was prepared by the following procedure.

75 g of 3-cyclohexene-1-methanol, 0.5 g of mercuric oxide and 0.5 g of boron trifluoride diethyl etherate were heated to 55° C. with stirring in a reactor, and then 30 g of vinyl acetate was slowly added portionwise thereto. After completion of the addition, the mixture was stirred for about 2 hours, heated to 60° C., stirred for 16 hours, and allowed to stand at room temperature for 2 days. Thereafter, 28 g of sodium carbonate and 125 g of ice-water were added to the reaction mixture, followed by rapid cooling. 50 ml of toluene was added to induce phase separation. The organic layer was separated and concentrated using a rotary evaporator. The residue was completely dried in a vacuum oven at 110° C.-125° C. to remove the remaining solvent, affording the desired acetal compound.

The epoxidation of the acetal compound was carried out as follows.

13.48 g of the acetal compound was dissolved in 150 ml of dichloromethane and 150 ml of acetone in a reactor, and then 100 ml of a 0.1 M phosphate buffer (pH 7.5) and 1.5 g of 18-crown-6 as a phase transition catalyst were added thereto. The reactor was immersed in a cooling bath to maintain the temperature of the mixture at 6° C. During the immersion, the mixture was continuously stirred. To the mixture were added a solution of 73.8 g of potassium peroxymonosulfate (Oxone, DuPont) in water containing 0.09 g of ethylene diamine tetraacetic acid and a 0.5 M KOH solution with stirring over a period of 2 hours until the pH reached 7.3-7.9. A 1.0 M KOH solution was very slowly added with stirring for about 4 hours to maintain the pH in the range of 7.3-7.9. Next, 100 ml of dichloromethane was added and stirred for about 5 minutes. 100 ml of dichloromethane was further added, followed by shaking and phase separation of the resulting mixture. The aqueous layer was discarded, and the organic layer was dried over magnesium sulfate, evaporated to remove the remaining solvent, and filtered, affording acetaldehyde bis(cyclohex-3-enylmethyl)acetal diepoxide (epoxy equivalent weight ~150 g/eq.) in a yield of ~95%.

Example 1

An anisotropic conductive film composition was prepared by mixing the following components.

(i) As a binder resin system acting as a matrix for film formation:

Nitrile butadiene rubber (NBR) resin (N-34, Nippon Zeon Co., Ltd. (Japan)) is dissolved in toluene/methyl ethyl ketone by 30% volume and this is prepared by 20% weight in total film composition, 20% by weight of a solution of a styrene-acrylonitrile copolymer resin (AP-61, Cheil Industries (Korea)) in toluene/methyl ethyl ketone azeotropic solvent by 40% volume, and 5% by weight of a solution of a phenoxy resin (E-4275, JER) in toluene by 40% volume.

(ii) As a cure system undergoing curing:

15% by weight of a bisphenol A epoxy resin (DER-331, DOW Chemical), and

15% by weight of a cresol novolac epoxy resin (YDCN-500-80P, Kukdo Chemical Co., Ltd. (Korea)).

(iii) 14% by weight of the acetaldehyde bis(cyclohex-3-enylmethyl)acetal diepoxide prepared in Synthesis Example 1.

(iv) 5% by weight of a solid modified imidazole curing agent (PN-21, Ajinomoto (Japan)) for a curable epoxy resin.

(v) 3% by weight of a solid imidazole curing accelerator (EH-3293, Adeka).

(vi) 3% by weight of insulated conductive particles (NCI) having a size of 5 µm as fillers for imparting conductivity to a final anisotropic conductive film.

Example 2

An anisotropic conductive film composition was prepared by mixing the following components.

(i) As a binder resin system acting as a matrix for film formation:

15% by weight of a solution of a nitrile butadiene rubber (NBR) resin (N-34, Nippon Zeon Co., Ltd. (Japan)) in toluene/methyl ethyl ketone by 30% volume, 20% by weight of a solution of a styrene-acrylonitrile copolymer resin (AP-81, Cheil Industries (Korea)) in toluene/methyl ethyl ketone azeotropic solvent by 40% volume, and 10% by weight of a solution of a phenoxy resin (PKFE, INCHEMREZ (USA)) in toluene by 40% volume.

(ii) As a cure system undergoing curing:

15% by weight of a bisphenol A epoxy resin (YL-980, JER), and

14% by weight of a cresol novolac epoxy resin (YDCN-500-90P, Kukdo Chemical Co., Ltd. (Korea)).

(iii) 19% by weight of the acetaldehyde bis(cyclohex-3-enylmethyl)acetal diepoxide prepared in Synthesis Example 1.

(iv) 4% by weight of an aromatic sulfonium hexafluoroantimonate (San aid SI-60L, SANSHIN Chemical) as a cationic curing agent for a curable epoxy resin.

(v) 3% by weight of insulated conductive particles (NCI) having a size of 5 µm as fillers for imparting conductivity to a final anisotropic conductive film.

Comparative Example 1

A composition was prepared in the same manner as in Example 1, except that 15% by weight of a solution of a nitrile butadiene rubber (NBR) resin (N-34, Nippon Zeon Co., Ltd. (Japan)) in toluene/methyl ethyl ketone by 30% volume, 15% by weight of a solution of an acrylic resin (SG-280, Nagase ChemteX Corp. (Japan)) in toluene by 30% volume and 10% by weight of a solution of a cresol novolac epoxy resin (YDCN-500-90P, Kukdo Chemical Co., Ltd. (Korea)) in toluene by 40% volume were used to obtain a binder resin system acting as a matrix for film formation.

Comparative Example 2

A composition was prepared by mixing the following components.

(i) As a binder resin system acting as a matrix for film formation:

20% by weight of a solution of a nitrile butadiene rubber (NBR) resin (N-34, Nippon Zeon Co., Ltd. (Japan)) in toluene/methyl ethyl ketone by 30% volume, 20% by weight of a solution of an acrylic resin (SG-80H, Fujikura Kasei Co., Ltd. (Japan)) in methyl ethyl ketone by 40% volume, and 5% by weight of a solution of a phenoxy resin (PKFE, INCHEMREZ (USA)) in toluene by 40% volume.

(ii) As a cure system undergoing curing:

27% by weight of a bisphenol A epoxy resin (DER-331, DOW Chemical), and

18% by weight of a cresol novolac epoxy resin (YDCN-500-80P, Kukdo Chemical Co., Ltd. (Korea)).

(iii) 4% by weight of an aromatic sulfonium hexafluoroantimonate (San aid SI-60L, SANSHIN Chemical) as a cationic curing agent for a curable epoxy resin.

(iv) 3% by weight of a solid imidazole curing accelerator (EH-3293, Adeka).

(v) 3% by weight of insulated conductive particles (NCI) having a size of 5 µm as fillers for imparting conductivity to a final film.

Each of the compositions was stirred at room temperature (25° C.) for 60 minutes at a rate such that the conductive particles were not broken. The composition was applied using a casting knife to a silicone release-treated polyethylene base film to form a film having a thickness of 20 µm. The film was dried at 50° C. for 10 minutes.

[Evaluation of Physical Properties and Reliability of the Films]

The initial physical properties and the reliability of the films produced using the compositions of Examples 1 and 2 and Comparative Examples 1 and 2 were evaluated in accordance with the following procedure. Each of the films was allowed to stand at room temperature for one hour. The film was connected to indium tin oxide (ITO) glass, a chip-on-film (COF), and a tape carrier package (TCP) at 160° C. for 1 sec (preliminary pressing) and under a pressure of 3 MPa at 180° C. for 5 sec (final pressing). Seven test pieces were prepared for each of the films prepared from Examples 1 and 2 and Comparative Examples 1 and 2. The test pieces were measured for 90° adhesive strength and connection resistance by the method of ASTM D3330/D3330M-04 and a 4-probe method (ASTM F43-64T), respectively. The reliability of the test pieces was evaluated after the test pieces were left standing under high temperature (85° C.) and high humidity (RH 85%) conditions for 1,000 hours (ASTM D117). The thermal shock reliability of the test pieces was evaluated after 1,000 cycles of cooling/heating (−40° C./80° C.) (ASTM D1183). The results are shown in Tables 1 and 2 in FIGS. 2 and 3, respectively.

The results in Table 1 show that the 90° initial adhesive strength and the adhesive strength measured after the reliability evaluation of the anisotropic conductive films prepared using the compositions of Examples 1 and 2, each including the acetal epoxy resin as a cure system component, were comparable or superior to those of the films prepared using the compositions of Comparative Examples 1 and 2 including no acetal epoxy resin.

The results in Table 2 show that the anisotropic conductive films prepared using the compositions of Examples 1 and 2, each including the acetal epoxy resin as a cure system component, had an initial low connection resistance and a low connection resistance after the reliability evaluation, compared to the films prepared using the compositions of Comparative Examples 1 and 2 including no acetal epoxy resin. These results indicate that the films prepared using the compositions of Examples 1 and 2 have initial physical properties and reliability comparable or superior to those of currently available anisotropic conductive films including a thermoplastic resin and an acrylic or phenoxy resin without using the acetal epoxy resin.

The time required to remove each cured film was measured in accordance with the following procedure. First, the film was connected to indium tin oxide (ITO) glass and a chip-on-film at 160° C. for 1 sec (preliminary pressing) and under a pressure of 3 MPa at 180° C. for 5 sec (final pressing). Five test pieces were prepared for each film. The COF was removed from the connection structure. A cotton bud was smeared with a solvent containing an acid and rubbed to remove the film. The time required for the removal of the cured film was measured. The results are shown in Table 3 in FIG. 4.

The results in Table 3 show that the anisotropic conductive films prepared using the compositions of Examples 1 and 2, each including the acetal epoxy resin as a cure system component, were removed in a shorter time after curing than the films prepared using the compositions of Comparative Examples 1 and 2 using no acetal epoxy resin.

The present invention has been described herein with reference to the preferred embodiments, including Synthesis Example 1 and Examples 1 and 2. Those skilled in the art will appreciate that various changes and modifications are possible, without departing from the scope and spirit of the present invention. The acetaldehyde bis(cyclohex-3-enylmethyl)acetal diepoxide prepared in Synthesis Example 1 is provided for illustrative purposes only, and it is to be understood that other suitable acetal epoxy resins may be used in the anisotropic conductive film composition. Such changes and modifications are within the scope of the present invention as disclosed in the accompanying claims.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An anisotropic conductive film composition, comprising:
   about 1 to about 80% by weight of a first epoxy resin including at least one of a bisphenol epoxy resin, a novolac epoxy resin, a glycidyl epoxy resin, an aliphatic epoxy resin, and an alicyclic epoxy resin;
   about 1 to about 50% by weight of a second epoxy resin including an acetal epoxy resin;
   about 1 to about 50% by weight of an additional polymer resin;
   about 0.1 to about 15% by weight of an epoxy resin curing agent; and
   about 0.01 to about 20% by weight of conductive particles.

2. The composition as claimed in claim 1, wherein the acetal epoxy resin is represented by Formula 2 or 3:

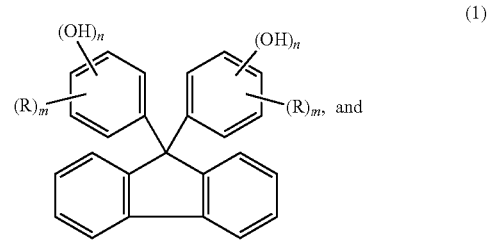

wherein:

in Formulae 2 and 3, R and R' are each independently a hydrogen atom, a $C_1$-$C_{20}$ alkyl group, an aryl group, or an aralkyl group, and in Formula 2, each [ ] is independently an alkylene.

3. The composition as claimed in claim 1, wherein the acetal epoxy resin has a weight average molecular weight of about 100 to about 500,000.

4. The composition as claimed in claim 1, wherein:
   the additional polymer resin includes at least one of an acrylonitrile resin, a styrene-acrylonitrile resin, a butadiene resin, an acrylic resin, a urethane resin, an epoxy resin, a phenoxy resin, a polyamide resin, an olefin resin, and a silicone resin, and
   the additional polymer resin has a weight average molecular weight of about 1,000 to about 1,000,000.

5. The composition as claimed in claim 4, wherein the additional polymer resin has a glass transition temperature of about 100° C. to about 200° C.

6. The composition as claimed in claim 1, wherein the first epoxy resin includes at least one of a solid epoxy resin, a liquid epoxy resin, and a soluble epoxy resin.

7. The composition as claimed in claim 1, wherein:
   the first epoxy resin includes a fluorene group represented by Formula 1:

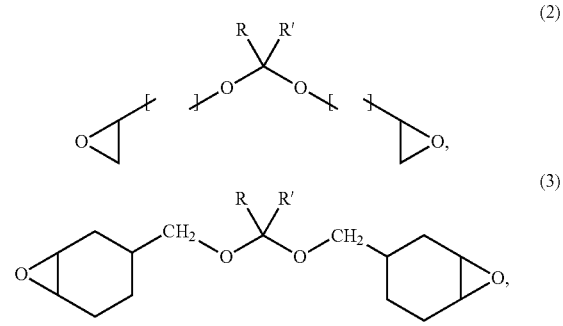

in Formula 1, each R is independently alkyl, alkoxy, aryl, or cycloalkyl, each m is independently an integer from 0 to 4, and each n is independently an integer from 2 to 5.

8. The composition as claimed in claim 1, wherein the epoxy resin curing agent includes at least one of an acid anhydride curing agent, an amine curing agent, an imidazole curing agent, a hydrazide curing agent, and a cationic curing agent.

9. The composition as claimed in claim 1, wherein the conductive particles include at least one of metal particles, carbon particles, metal-coated resin particles, and conductive particles coated with insulating particles.

10. The composition as claimed in claim 1, wherein the composition further comprises an additive including at least one of a polymerization inhibitor, an antioxidant, a heat stabilizer, a curing accelerator, and a coupling agent.

11. The composition as claimed in claim 10, wherein the composition comprises about 0.01 to about 5% by weight of the additive.

12. An anisotropic conductive film
    prepared from the anisotropic conductive film composition as claimed in claim 1.

* * * * *